United States Patent [19]

Rabin et al.

[11] Patent Number: 5,159,336
[45] Date of Patent: Oct. 27, 1992

[54] TAPE CONTROLLER WITH DATA COMPRESSION AND ERROR CORRECTION SHARING A COMMON BUFFER

[75] Inventors: Steve Rabin, San Diego; Peter L. Skeggs, Cardiff, both of Calif.

[73] Assignee: Iomega Corporation, Roy, Utah

[21] Appl. No.: 744,319

[22] Filed: Aug. 13, 1991

[51] Int. Cl.⁵ .............................................. H03M 7/38
[52] U.S. Cl. ....................................... 341/51; 395/275
[58] Field of Search ........................ 341/51, 65, 67, 94

[56] References Cited

U.S. PATENT DOCUMENTS

| | | | |
|---|---|---|---|
| 4,464,650 | 8/1984 | Eastman et al. | 341/51 |
| 4,558,302 | 12/1985 | Welch | 341/51 |
| 4,847,619 | 7/1989 | Kato et al. | 341/106 |
| 4,929,946 | 5/1990 | O'Brien et al. | 341/87 |
| 5,003,307 | 3/1991 | Whiting et al. | 341/51 |
| 5,016,009 | 5/1991 | Whiting et al. | 341/67 |

Primary Examiner—Marc Hoff
Attorney, Agent, or Firm—Woodcock Washburn Kurtz Mackiewicz & Norris

[57] ABSTRACT

A controller has a data compression unit and error correcting code unit which share a single common random access memory. The controller is connected between a host computer and a peripheral device such as a tape drive. A second order search for strings of data bytes is enabled or disabled to change the compression ratio, data throughput, and memory bandwidth constraints.

17 Claims, 7 Drawing Sheets

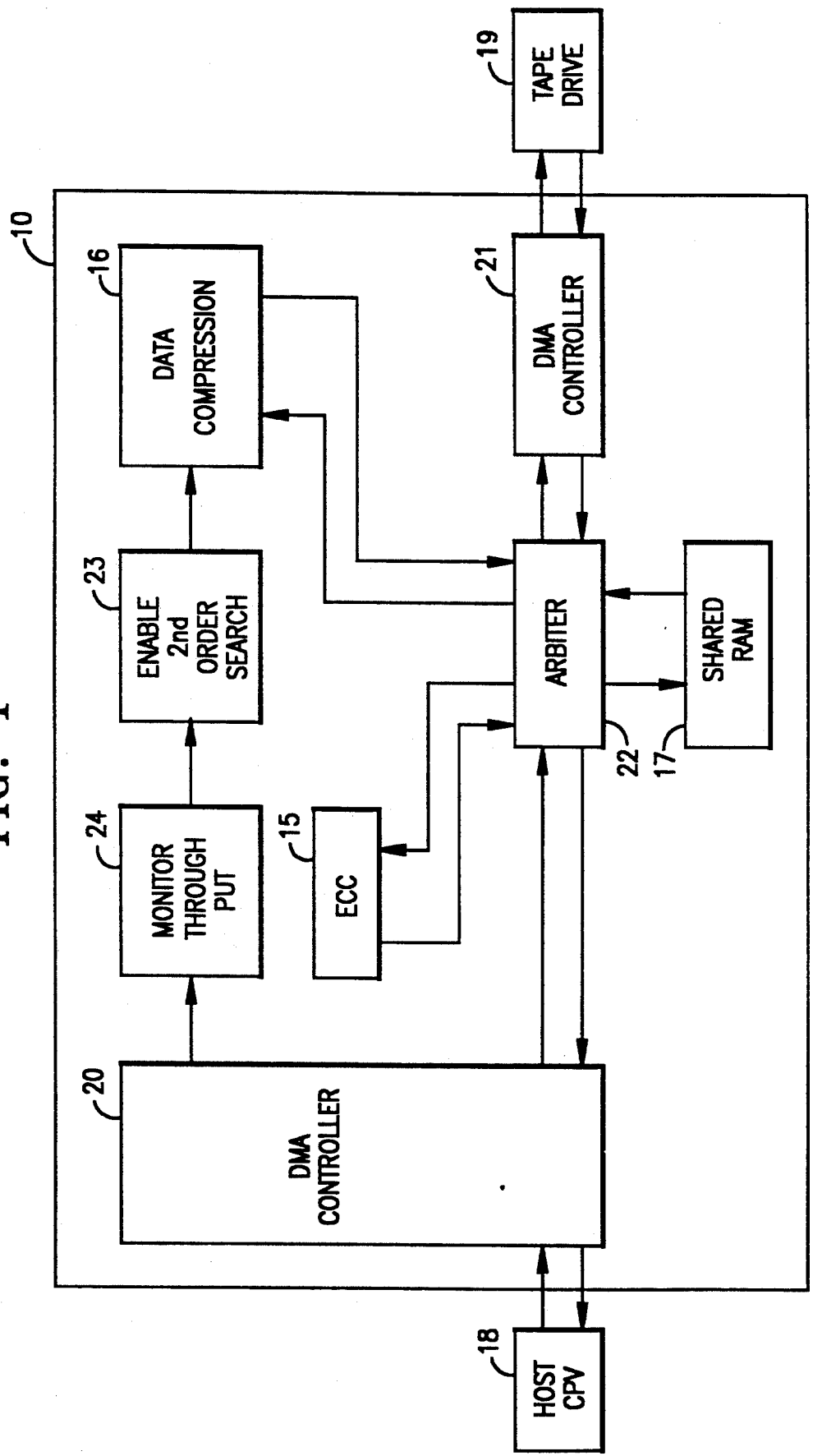

LOOKASIDE

TAPE CONTROLLER WITH DATA COMPRESSION AND ERROR CORRECTION SHARING A COMMON BUFFER

FIELD OF THE INVENTION

This invention relates to a data compression unit for connection between a host computer and a peripheral device such as a magnetic tape unit. More particularly, the invention relates to controlling data flow between the host computer and the tape unit by enabling or disabling a second order search in order to adjust data throughput and the data compression ratio.

BACKGROUND OF THE INVENTION

Data compression is used to save data storage space on magnetic tapes. See "What's Keeping Data Compression Off Disks?", Computer Technology Review, Dec. 1990, pp. 26 and 28, and "Data Compression's Not the Whole Answer", Computer Technology Review, Mar. 1991, pp. 30 and 32.

These articles discuss data compression for peripheral storage units. Data compression units are connected in an "inline" mode or in a "look aside" mode with an error correcting code (ECC) co-processor. See also the product description for STAC 9703 Data Compression Co-Processor, STAC Electronics, 5993 Avenida, Encinas, Carlsbad, Calif. 92008; Data Compression Algorithm Performance Comparison, Robert Monsour, Director of Marketing, STAC Electronics, Feb. 20, 1989; and A.H.A. 3101 Data Compression Coprocessor IC, Product Specification, Jul. 16, 1990, Advanced Hardware Architectures, Inc. P.O. Box 9669, Moscow, Id. 83843.

In the architectures discussed in these references, there are two separate buffer memories, one for the ECC unit and one for the data compression unit, each having its own interface.

It is an object of the present invention to provide a new architecture in which the data compression unit and the error correcting code unit share a single buffer memory. Storing ECC and compression information in a single buffer memory reduces systems complexities and part counts. On the other hand, in this new architecture the available memory bandwidth has been reduced, and it is possible that the single buffer interface will become a performance bottleneck in some applications. Memory bandwidth is the product of memory speed times the width of the bus into the memory. Memory speed is a given for the device being used. The width of the input path is reduced when a single buffer interface is used in accordance with the present invention. In these cases it might be desirable to reduce data compression overhead in order to meet memory bandwidth constraints.

It is another object of the present invention to adjust the compression ratio to accommodate memory bandwidth constraints of the single shared buffer memory.

In other situations it is desirable to adjust the data throughput. Sometimes a streaming tape drive is connected to a slow host computer which cannot keep up with the required data rate. In the presence of data compression multiple bytes are required from the host for each byte written to tape. It therefore may be desirable to adjust the compression ratio to match data rates. A streaming tape drive is one which is storing data as fast as it receives it, or is outputting data bytes as fast as they can be processed by the host computer. If the tape drive is outputting, or taking input, faster than the host computer, it is necessary for the drive to stop tape movement, rewind, and begin tape movement again when the host computer is ready. This situation is commonly referred to as "shoe shining". It is a condition to be avoided.

It is another object of the invention to adjust the compression ratio so that the data throughput between the host computer and the tape drive can be matched, i.e., the tape drive can be maintained in a streaming condition.

Small tape drives for writing and reading data stored on ¼-inch tape cartridges use data compression techniques. DATA COMPRESSION FORMAT FOR ¼"-INCH DATA CARTRIDGE TAPE DRIVES", QIC-122, Rev. B., Feb. 6, 1991, published by Quarter-Inch Cartridge Drive Standards, Inc., 344 E. Carillo Street, Santa Barbara, Calif. 93101 is a development standard for such tape drives. Such tape drives are commonly configured in a personal computer system which includes a host CPU and a controller for the tape drive and other peripherals.

SUMMARY OF THE INVENTION

In accordance with the present invention, an error correcting code unit and a data compression unit share a single random access memory providing buffer memory for both units. In accordance with the invention, the data compression unit is controlled to alter the compression ratio and the data throughput of the compression unit by changing the search routine in the data compression unit.

The data compression unit searches for strings of data bytes which match other strings in a stream of data bytes passing from the host computer to the peripheral unit. As each subsequent byte is processed, a determination is made as to whether that byte is a natural extension of the current matching string. If it is not, a second order search is undertaken. In the particular embodiment being described, the second order search is a fall-through search on all previously processed bytes to find strings which have a length greater than the current match length.

In accordance with the present invention, the second order search is enabled or disabled in order to change the compression ratio and data throughput, and in order to accommodate memory bandwidth constraints.

The foregoing and other objects, features and advantages of the invention will be better understood from the following more detailed description and appended claims.

SHORT DESCRIPTION OF THE DRAWINGS

FIG. 1 is a block diagram showing the invention;

DESCRIPTION OF THE PREFERRED EMBODIMENT

Figure 1A:
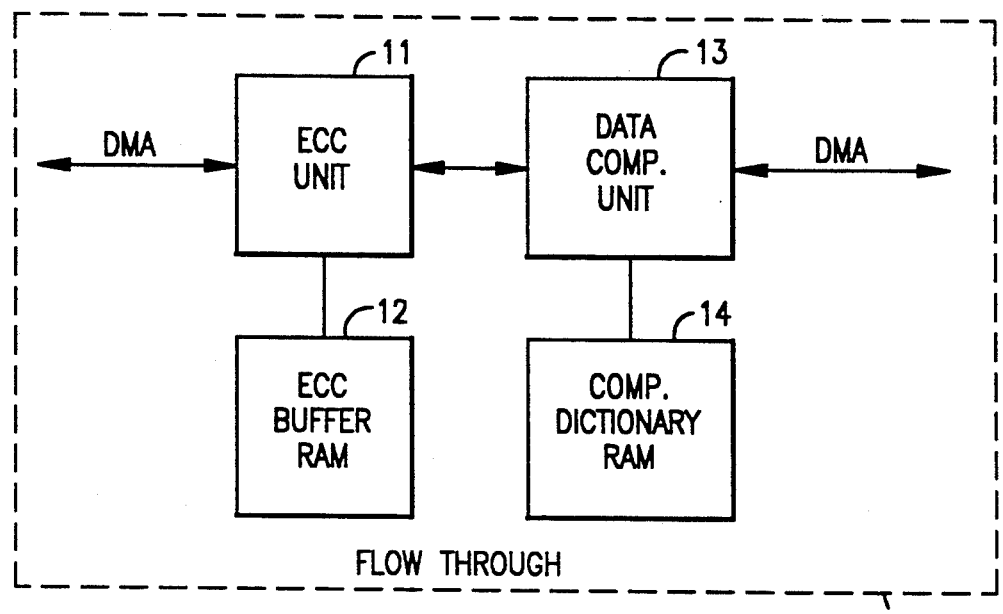
FIG. 1A shows a prior art flow-through configuration of the error correction code unit and data compression unit.
Figure 1B:
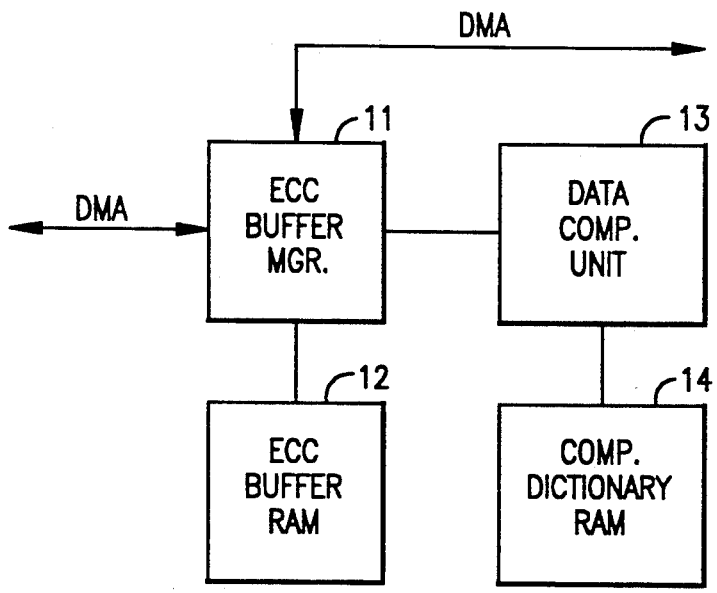
FIG. 1B shows a prior art look aside configuration for the ECC unit and data compression unit.

Prior Art, FIGS. 1A and 1B

Currently available tape drive data compression hardware uses either a flow through configuration as shown in FIG. 1A or a look aside configuration as shown in FIG. 1B. A controller 10 has an error correcting code unit 11 which has its own buffer 12. The data compression unit 13 has its own compression dictionary in a RAM 14. Each separate buffer memory has its own interface.

The Invention, FIG. 1

In accordance with the present invention, shown in FIG. 1, the controller 10, has an error correcting code unit 15 and a data compression unit 16 which share a common random access memory 17. Controller 10 is connected between the host CPU 18 and the tape drive 19. Communication with the host is over a bus under control of DMA controller 20 and communication with the tape drive is over a bus under control of DMA controller 21. As an example, the Intel 8237A programmable DMA controller described in that company's specification dated Oct. 1989, or the Motorola MC6844 DMA controller described at page 3-1765 of Motorola Micropress Processor Data are suitable for use. The DMA controllers contain an arbiter to allocate use of a shared DMA bus between several DMA sources seeking to utilize this shared bus.

Similarly, the ECC unit 15 and the data compression unit 16 share a common bus to the RAM 17 under control of an arbiter 22. Arbiter 22 allocates the bus to the RAM 17, to the ECC unit 15, or the data compression unit 16 as required. Chapter 1, Section 1.5.1 of FUNDAMENTALS OF DIGITAL SYSTEMS, MIT Lecture Notes, Aug. 29, 1982 describes an arbiter in sufficient detail for implementation of an arbiter suitable for use.

In accordance with the present invention, the bit 23 is set, or reset, to enable or disable a second order search in data compression unit 16. When the second order search is disabled the compression ratio and the buffer bandwidth requirements decrease and the data throughput increases. The bit 23 is adjusted under firmware control without regard for file, block or frame boundaries, allowing for adjustment of compression ratios, rate of compression and buffer bandwidth use, and data throughput. The controller 10 normally monitors the throughput of data between the host and the tape drive, as indicated at 24 in FIG. 1. This monitor can be used to set or reset the second order search bit 23 in accordance with data throughput. When the host is operating with the tape drive in real time, it is desirable to maintain the tape drive in a streaming condition so that responses are as fast as possible. In this case, the second order search is disabled. On the other hand, when the tape drive is being used for backup, time is not normally the primary consideration. Rather, the primary consideration is obtaining as much data compression as possible. Therefore, when doing backup the second order search bit 23 will normally be set to a condition which enables the second order search.

The Data Compression Unit and the Random Access Memory, FIG. 1

Figure 2:
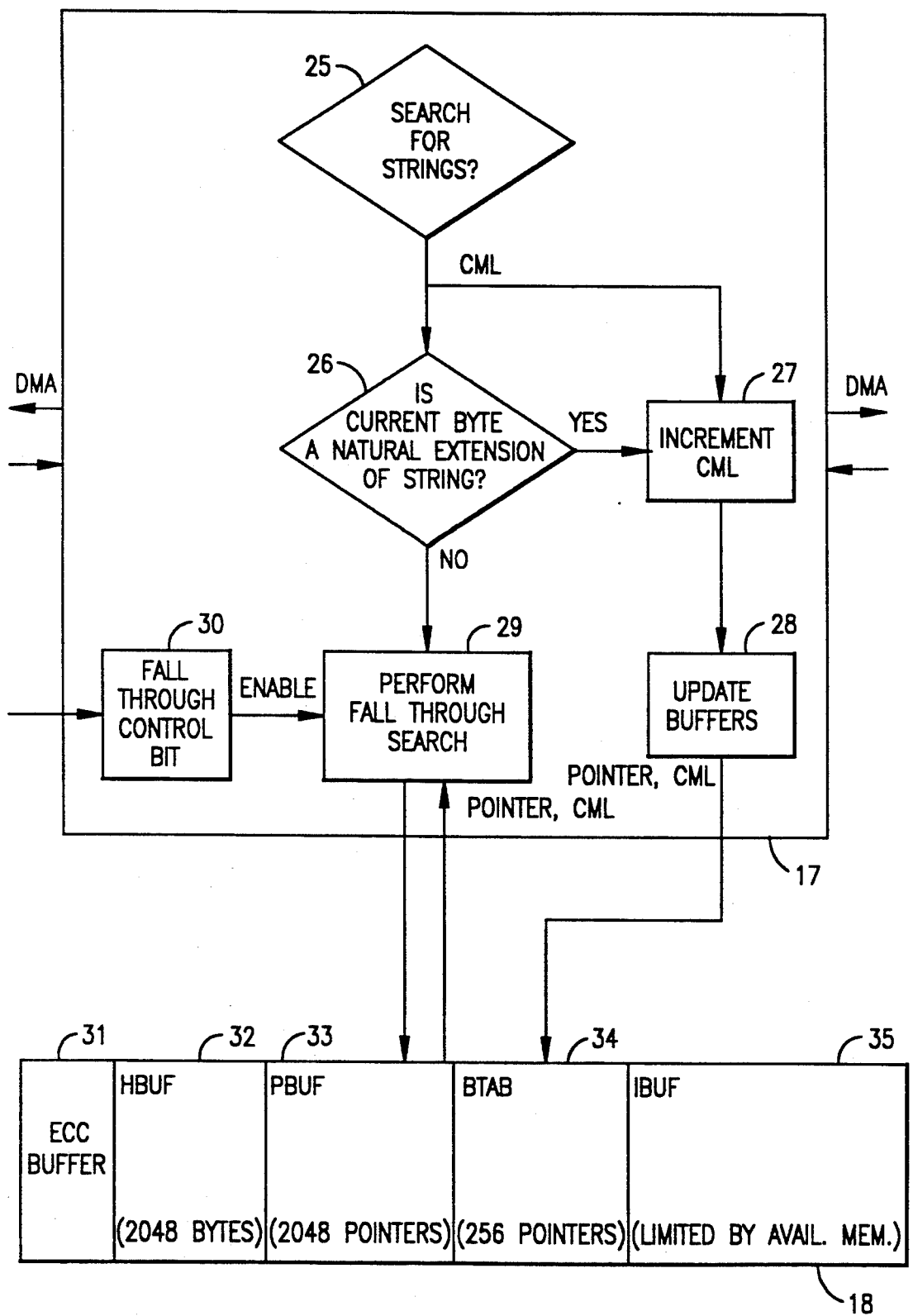
FIG. 2 depicts the data compression unit, arbiter and buffer memory of the present invention in more detail.

FIG. 2 shows the data compression unit 16 and the shared random access memory 17 in more detail. The step 25 searches for strings of like data bytes and stores a pointer which points to the head of a linked list. The length of the matching strings is the current match length, CML. When a raw byte from the host computer is processed, a determination is made as to whether a current byte is a natural extension of the string, as indicated at 26. If the current byte is a natural extension of the string, the current match length is incremented as indicated at 27. The buffers are updated, as indicated at 28.

If the current byte is not a natural extension of the string, then a second order search may be performed. The particular search described herein will be referred to as a "fall-through search". Its performance is indicated at 29 in FIG. 2. The search is performed under control of the fall through control bit 30. As previously discussed, if this bit is set, the fall through search is enabled, hence increasing the compression ratio. If it is not set, the second order fall through search is not performed and memory bandwidth constraints are eased and data throughput from the host to the tape drive increases.

The shared RAM 17 has the following data structures. An ECC buffer 31 maintains the memory space required for error correction coding. The data compression unit uses a history byte buffer 32 (HBUF), a pointer buffer 33 (PBUF), a pointer, or index, buffer 34 (BTAB), and an input byte buffer 35 (IBUF).

History buffer 32 records the last 2048 bytes which are successfully outputted by the compression unit.

The pointer buffer 33 provides a linked list of all occurrences of each byte value appearing in the history buffer. There are 2048 pointers.

The index buffer 34 points to the head of the linked list for each byte value appearing in the history buffer. There are 256 different bytes which can be processed. The index buffer has room for 256 pointers, one for each byte.

Input buffer 35 contains input bytes for which no compressed representation has been produced. The amount of memory allocated to this input buffer is limited by available memory.

Figure 3:
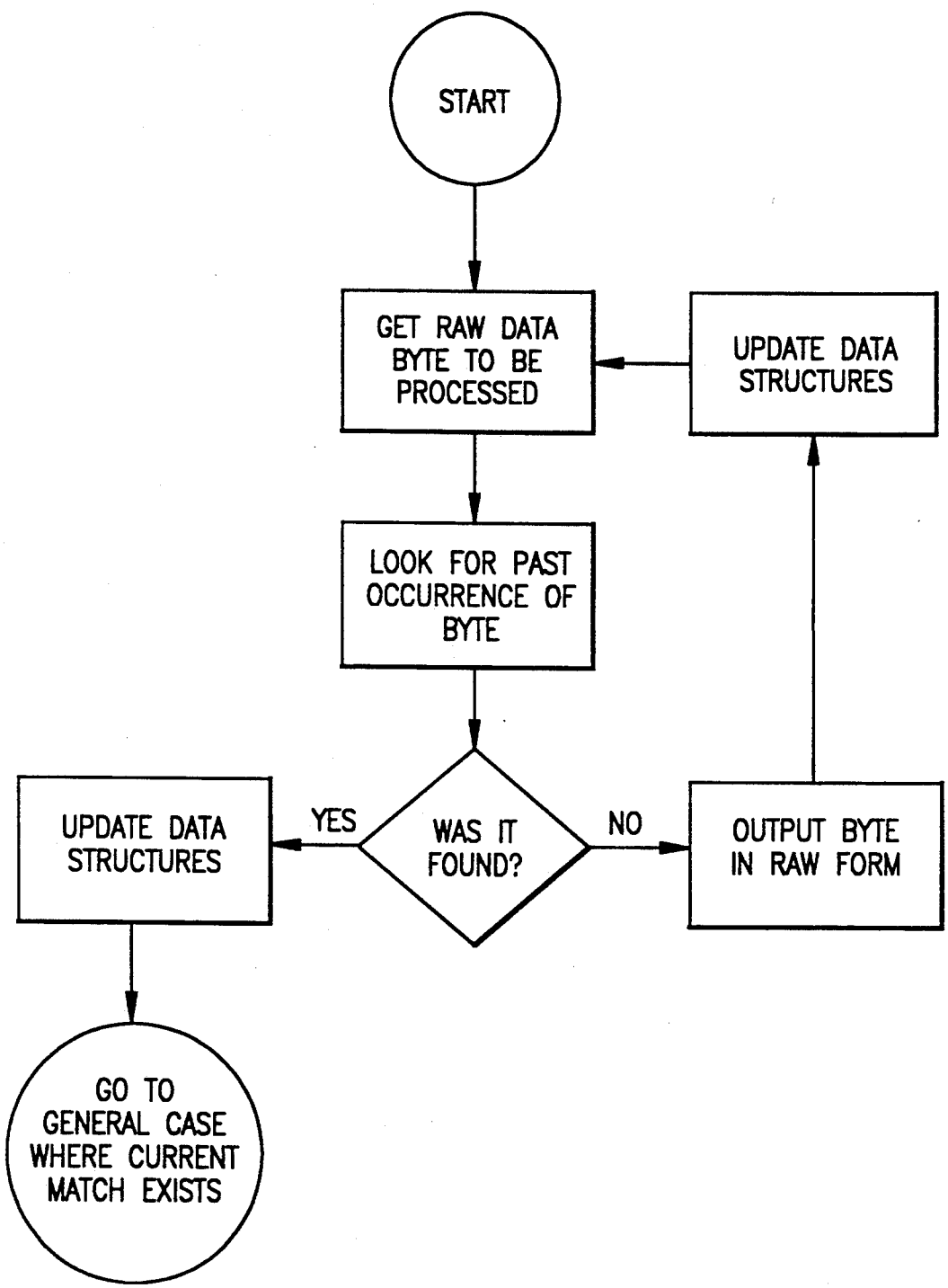
FIG. 3 is a flow chart depicting a simple case where no current match exists.
Figure 4:
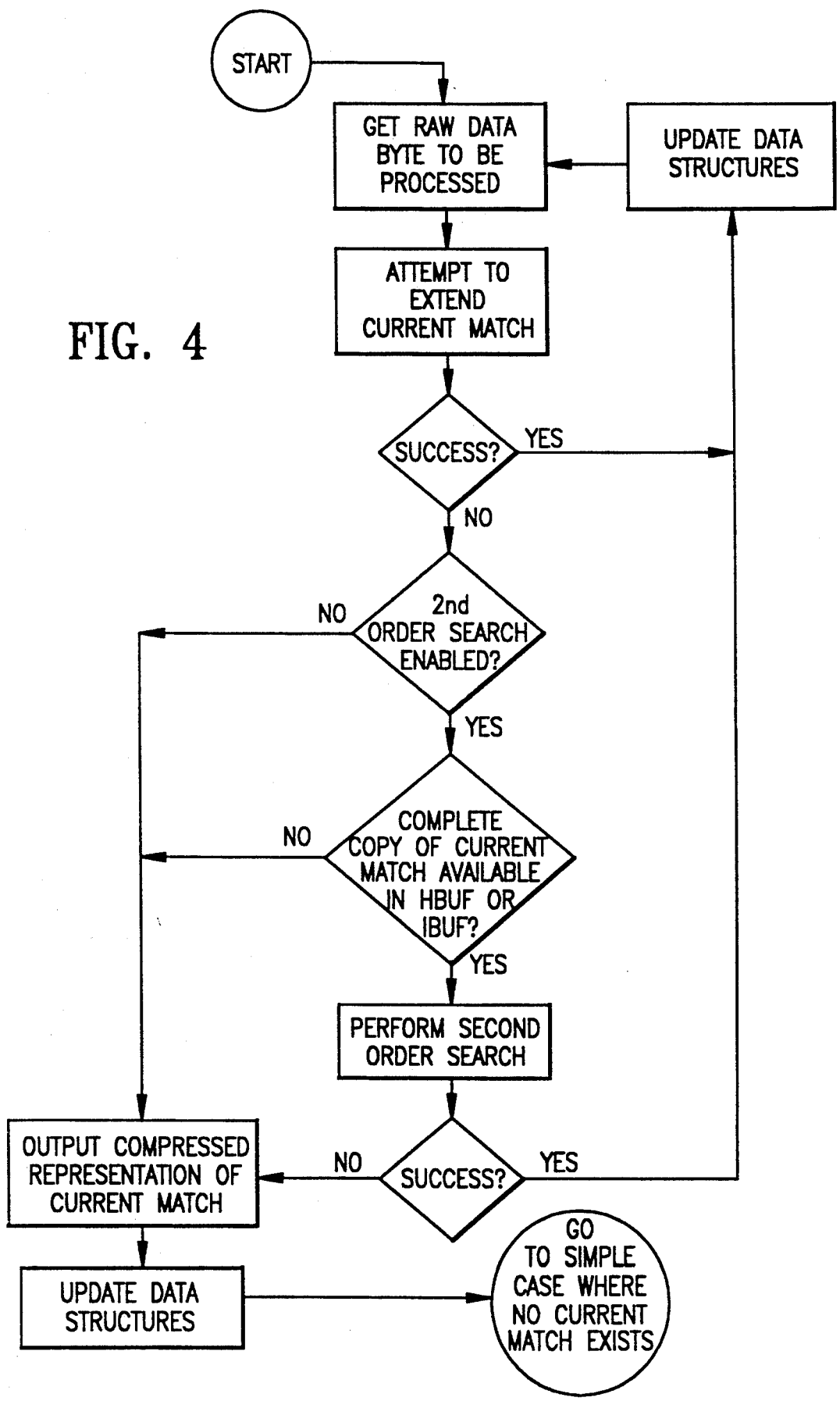
FIG. 4 is a flow chart depicting a general case where a current match exists.
Figure 5:
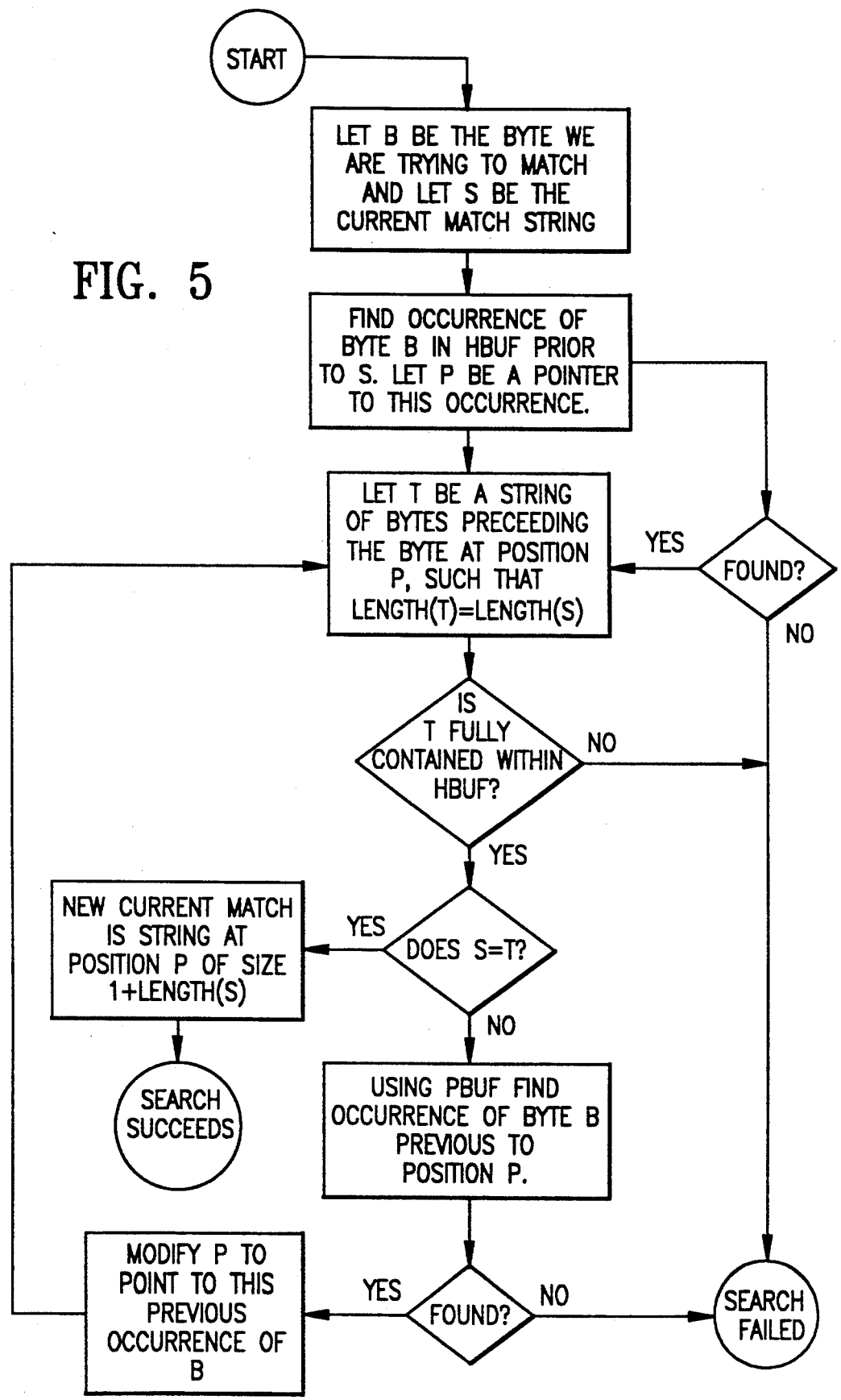
FIG. 5 is a flow chart depicting one possible method for a second order search.

More Detailed Description of the Search Procedure, FIG. 3-5

FIGS. 3-5 are flow charts showing the search procedure in more detail. FIG. 3 depicts a simple case where no current match exists. FIG. 4 is a flow chart depicting a general case where a current match exists. FIG. 5 is a flow chart depicting one possible method for a second order search.

The data compression unit 16 maintains a current match consisting of a pointer into HBUF 32 (FIG. 2) and a current match length (CML). Initially CML=0, and the pointer is the NULL pointer. When a raw byte is processed, BTAB 34 is consulted, and if the byte occurs in HBUF 32, then the current match becomes that byte. As each subsequent byte is processed, the data compression unit will attempt to extend the current match by incrementing CML. FIG. 3 depicts the simple case where no current match exists and the byte becomes an output in raw form. If the byte is found, a current match exists, the procedure of FIG. 4 is followed. If the extended current match miscompares with the raw data, i.e., the unit is unable to extend the current match, then a "Fall-Through" condition occurs. If the fall-through control bit 30 (FIG. 2) is set and IBUF 35 contains a complete copy of the current match, then a second order fall-through search will be undertaken. A fall-through search will search through HBUF 32 looking for strings of length CML+1 matching the raw data stored in IBUF 35. Any match found becomes the current match. Otherwise the current match is output in compressed form (offset, length), and CML is set to zero, with the byte which caused the fall-through remaining to be processed. When a byte does not occur in HBUF 32, it will be output in raw form. HBUF 32, PBUF 33 and BTAB 34 are updated whenever bytes are successfully output by the compression unit.

When all input data have been processed, the data compression unit will output any current match and append an <end> symbol.

In the case of a very long match, it is possible that the storage requirements of IBUF 35 would exceed available resources. In this case, the compression unit can abandon maintenance of the IBUF 35. Since IBUF 35 no longer contains a complete representation, the next fall-through event will fail without a search.

FIG. 5 depicts one possible method for a second order search. For possible alternatives, refer to "The Art of Programming", Vol. 3, SORTING AND SEARCHING, by David Knuth, ISBN 0-201-03803-X.

Specific Example of a Second Order Search

A specific example of one method of implementing the search is described below in pseudo-Pascal.

```
procedure update_HBUF_PBUF_BTAB(b:output_byte);
begin
inc(index):            {advance end of buffer}
hbuf[index]:=b;        [enter byte at end of buffer]
i:=btab[b];            {lookup previous occurrence}
pbuf[index]:=i;        {link byte at end of buffer ... }
btab[b]:=index;        { ... pointing to previous occurrence}
if index=LIMIT
  then rewind;         {rewind circular buffer, check for stale
                        absolute pointers}
end;
var matchp,            {points to start of current match}
```

```
                       -continued
matcht:pointer;        {points to tail of current match}
function fallthrough:boolean;var found:boolean;
begin
  repeat
    i:=pbuf[matchp]:   {previous candidate match with same
                        init.byte}
    if(i<=cutoff)then  {pointer is too far back in history}
    return (failure)
    else matchp:=i;    {set current match to candidate}
    matcht:=matchp;    {string comparison of current match with
                        IBUF}
    found:=true;
    i:=0
    repeat
      inc(i);
      inc(matcht);
      if buf[i]<>hbuf[matcht]then found:=false; {failure ... }
    until (not found) or (i>=matchlen);
  until found;                        { ... try prior
                                        candidate}
  return(success);                    {success - we found
                                        a previous match}
end
```

The update procedure is performed each time a compressed byte is output. The fall-through procedure takes place each time a byte is processed which is not a natural extension of the current match.

Note that matchlength must have been incremented and the byte which caused the fall-through search must be included in IBUF before function fall-through is invoked. Standard methods can be used to implement HBUF and PBUF as circular buffers, and to represent absolute points in 16 bits. PBUF points could alternatively be represented as a 12 bit relative offset with a zero value representing a null pointer.

Example of Operation

The following is a description of an example of how the data compression procedure works to produce a compressed data format compatible with the aforementioned QIC-122 Development Standard. The example is how the input bytes ABAAAAAACABABABA are compressed. This is the same example which is given on pages 8 and 9 of the aforementioned QIC-122 Development Standard, Rev. B, Feb. 6, 1991. Familiarity with the example in that Standard will be helpful in understanding the following example.

|   | Input Byte | New Current Match ptr,length | Fall-Through | Other Action | Update HBUF etc. | IBUF |
|---|---|---|---|---|---|---|
| 1 | A | NIL,0 | n/a | Output raw A | Y | — |
| 2 | B | NIL,0 | n/a | Output raw B | Y | — |
| 3 | A | 1,1 | n/a |  | N | A |
| 4 | A | 3,1 | Fails | Output {1,1}= raw A | Y | A |
| 5 | A | 3,2 | n/a |  | N | AA |
| 6 | A | 3,3 | n/a |  | N | AAA |
| 7 | A | 3,4 | n/a |  | N | AAAA |
| 8 | A | 3,5 | n/a |  | N | AAAAA |
| 9 | C | NIL,0 | Fails | Output {3,5}, output raw C | Y | — |
| 10 | A | 8,1 | n/a |  | N | A |
| 11 | B | 1,2 | Succeeds |  | N | AB |
| 12 | A | 1,3 | n/a |  | N | ABA |
| 13 | B | 11,1 | Fails | output 1,3} | Y | B |
| 14 | A | 11,2 | n/a |  | N | BA |
| 15 | B | 11,3 | n/a |  | N | BAB |

-continued

| Input Byte | New Current Match ptr,length | Fall-Through | Other Action | Update HBUF etc. | IBUF |
|---|---|---|---|---|---|
| 16 | A | 11,4 eoi | n/a | output {11,4} <end> | N | BABA |

The first byte is an A. There were no previous A bytes in this data segment, so when BTAB buffer 34 is searched, no previous A's are located. If there were A's previously processed, BTAB buffer 34 would point to the list of all of the A's that appear in the buffer. An A is stored in buffer 32 and the BTAB buffer 34 is updated to point to that A, which has been stored in buffer 32. A raw A is outputted.

The second byte received is a B. Again, no previous B's were received. The BTAB buffer 34 is consulted, but no B's are located. B is stored in the history buffer 32 and a pointer is stored in BTAB 34 pointing to the head of the list of all B's in the history buffer. A raw B is outputted.

The third byte is an A. BTAB buffer 34 contains the pointer to an A in the history buffer 32. There is a match. The match is a 1,1 which indicates an A at position 1, with a current match length (CML) of 1. The IBUF 35 is updated to store an A which is an input byte for which no compressed representation has yet been produced. There is no output.

The fourth byte received is an A. First, a search is made to determine whether that A is a natural extension of the current match which is position 1, and of length 1. The length of the current match is extended to position 2. The B at position 2 does not match the A in position 4, so there is no natural extension. In this case, the second order fall-through search is performed and it fails. The current match 1,1 is outputted. BTAB 34 is updated to point to the most recent A which is the A in position 3. PBUF 33 is updated so that the entry for the A in position 3 is a link to the A in position 1. The previous current match has been outputted, and now the A in position 4 is processed. A search is made to determine whether there are any previous A's in the buffers, and there are. This A matches the A in position 3, so the new current match is 3,1, pointing to the A in position 3, and the match length is 1.

The fifth bit is an A. A search is made to determine whether the A in position 5 is a natural extension of the 3,1 current match. It is. The current match becomes 3,2 which includes the A's at positions 3 and 4 and the new A at position 5. The new A goes into IBUF 35 which contains a copy of the current match. The current match is a pair of A's and IBUF 35 stores this pair of A's.

The sixth byte is also a natural extension of the current match. The current match length is increased to 3,3. There are three A's stored in the I buffer.

The seventh byte is also an A, as is the eighth byte. In each case, the current match length is extended. After processing the A in position 8, the current match is 3,5 which means that the string starts at position 3, and runs for a length of 5. The current match consists of five A's and the contents of IBUF 35 are updated to reflect this string. Nothing is outputted so the other buffers need not be updated.

The ninth bit is a C. Comparing the C at position 9 with the A at position 8, the natural extension fails. Then, the fall-through search is performed. A search is made as to whether there have been five A's followed by a C any place in the stream of input bytes thus far received. The history buffer 32 does not contain such a string. The way the search is performed is that at every A in the history buffer, a determination is made as to whether it is followed by four A's and a C. This is a time consuming search. However, if the string were matched a great savings in tape storage space would result. Since the fall-through search failed, the current match is outputted. The five A's contained in the IBUF 35 are outputted. Also, history buffer 32 is updated to contain five A's. As each A is put into the history buffer, the P buffer 33 is updated to point to the previous A which was contained in the index buffer 34. BTAB 34 is updated to point to the current A. In this manner, BTAB 34 points to a linked list of all previous A's in the buffer. Now all five A's are in the history buffer. Links to them are stored in pointer buffer 33, and BTAB 34 points to the head of the linked list. Now the C is processed. Searching BTAB 34, no C's have thus far been processed. The C does not match, so there is no current match. The raw C is outputted and a pointer in BTAB indicates the most recent C.

The tenth byte is an A. A previous A is in the history buffer at position 8, so the current match becomes 8,1. Nothing has been outputted, so the H buffer 32 is not updated. The current match has been extended, so the A is added to the IBUF 35.

The eleventh byte is a B. First, a determination is made as to whether the current match 8,1 can be extended to 8,2. There is no natural extension of the current match. In this case, a fall-through search is performed. Is the A in position 7 followed by a B at position 8? No. Is the A in position 6 followed by a B? No. The same comparison is made all the way to the A in position 3. Is that followed by a B? No. Is the A in position 1 followed by a B? Yes. So the fall-through search for a match succeeded. The new match is 1,2. The current byte just processed is stored in the I buffer 35, which now contains AB.

The twelfth byte gives a natural extension of the current match, so the new current match becomes 1,3. The IBUF is updated so that it now contains ABA.

The operation proceeds in a similar manner for the thirteenth through sixteenth bytes.

In this manner, a compression has been obtained which is compatible with the QI standards. Because of the second order search, a greater compression ratio has been obtained than heretofore.

Example of Increased Compression Ratios

Figure 6:
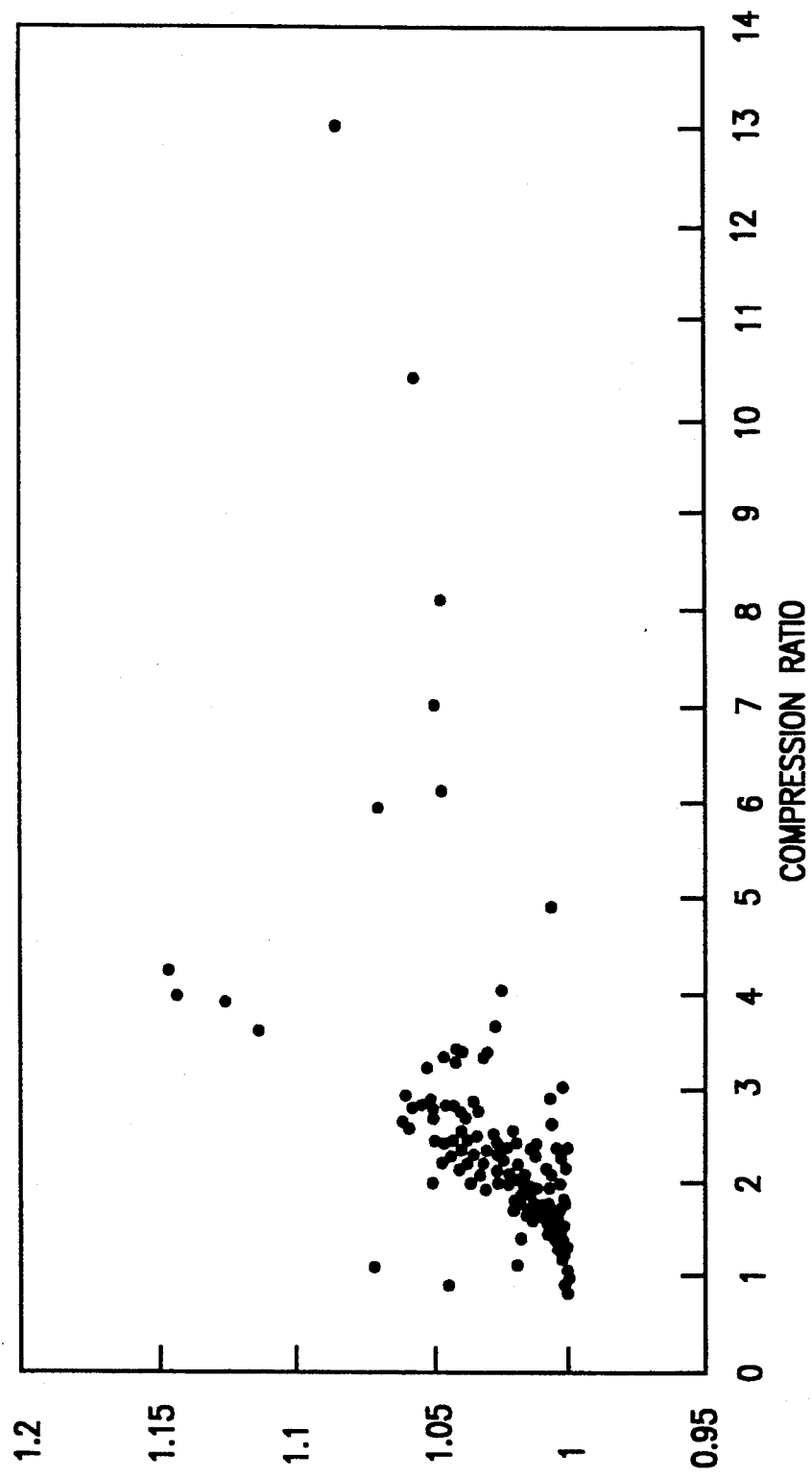
FIG. 6 is a chart showing compression ratios obtained using the invention and using a prior art technique.

FIG. 6 shows a comparison of the compression ratios obtained by using the present invention as compared to the compression ratios obtained using the aforementioned STAC Electronics 9703 chip. Each dot in FIG. 4 represents one of 240 randomly chosen data files which were compressed using a software implementation of the present invention and which were also compressed using the STAC chip. Each dot on the graph represents one file. The abscissa represents the compression ratio obtained for that file by using the present invention. The ordinate represents the ratio of the compression ratio of the invention to the compression ratio obtained by the STAC chip. Note the two files having a ratio of 1.15. These two files were compressed approximately 15% smaller than by using the STAC 9703 chip. Many of the files were compressed to approximately the same compression ratio. However, no files were compressed to a size larger than would have resulted from using the 9703 chip. The ratios are correlated to the compressibility of the file. The present invention significantly obtains better compression on files which have a high level of redundancy.

Implementation of the Invention

The invention can be implemented with hardware, with software, or with firmware. One particularly advantageous implementation is where the compression unit 16, ECC unit 15, shared RAM 17 and arbiter 22 are integrated into a single VLSI integrated circuit.

While a particular embodiment of the invention has been shown and described, various modifications of the invention are within the true spirit and scope of the invention. All such modifications are encompassed by the following claims.

What is claimed is:

1. A controller for connection between a host computer and a peripheral device for said computer comprising:
    an error correcting code unit;
    a data compression unit;
    a single shared random access memory providing buffer memory for both said error correcting unit and said data compression unit;
    a single memory bus between said shared random access memory, said error correcting code unit and said data compression unit; and
    an arbiter controlling said ECC unit and said data compression unit to share access to said random access memory across said bus.

2. The controller recited in claim 1 wherein said data compression unit performs a primary search for repeated occurrences of strings in a stream of data bytes passing from said host computer to said peripheral unit; and
    means for controlling the search in said data compression unit to alter the compression ratio and the data throughput of said compression unit.

3. The controller recited in claim 2 wherein said data compression unit includes:
    means for performing a more extensive second order search in which the stream of bytes being processed is searched for strings of length greater than the current match length; and
    means for enabling and disabling said means for performing a second order search to adjust the compression rate of said compression unit.

4. The system recited in claim 3 wherein said controller is connected between said host computer and said peripheral unit and wherein said controller contains a control bit enabling and disabling said second order search, said control bit being set by said controller in response to data throughput from said host computer to increase the ratio of compressed bytes to bytes not compressed, thereby reducing said compression rate.

5. The controller recited in claim 2 wherein said data compression unit includes:

means for storing strings of data bytes which match other strings in a stream of data bytes passing from said host computer to said peripheral unit;
    means for searching for natural extensions of the current match length as each subsequent byte is processed;
    means for performing a second order search in which the stream of bytes is searched for strings of length greater than the current match length; and
    means for enabling and disabling said means for performing said second order search to adjust the compression rate of said compression unit.

6. The system recited in claim 5 wherein said shared random access memory includes:
    a history buffer for storing groups of bytes processed by said compression unit;
    a buffer pointing to the head of a linked list for each byte value appearing in said history buffer; and
    means for updating said history buffer each time a byte is processed by said compression unit and wherein said second order search is performed if the current match length is not extended, said second order search being performed on all previously processed bytes for strings greater than the current match length.

7. The system recited in claim 6 wherein said random access memory includes:
    a pointer buffer containing a linked list of all occurrences of each byte value appearing in said history buffer, and wherein said pointer buffer is updated as each byte is processed.

8. The system recited in claim 6 further comprising:
    an input buffer containing input bytes for which no compressed representation has been produced.

9. The system recited in claim 1 wherein said peripheral is a tape drive.

10. The system recited in claim 1 wherein said error correcting code unit, said data compression unit, said shared random access memory and said arbiter are integrated into a single VLSI integrated circuit.

11. A data compression unit for connection between a host computer and a peripheral device for said computer comprising:
    means for performing a primary search for repeated occurrences of strings in a stream of data bytes passing from said host computer to said peripheral unit;
    means for controlling the search in said data compression unit to alter the compression ratio and the data throughout of said compression unit;
    means for performing a more extensive second order search in which the stream of bytes being processed is searched for strings of length greater than the current match length; and
    means for enabling and disabling said means for performing a second order search to adjust the compression ratio of said compression unit.

12. The data compression unit recited in claim 11 further comprising:
    means for storing strings of data bytes which match other strings in a stream of data bytes passing from said host computer to said peripheral unit;
    means for searching for natural extensions of the current match length as each subsequent byte is processed;
    means for performing a second order search in which the stream of bytes is searched for strings of length greater than the current match length; and means for enabling and disabling said means for performing said second order search to adjust the compression rate of said compression unit.

13. The system recited in claim 11 wherein said random access memory includes:
   a history buffer for storing groups of bytes processed by said compression unit;
   a buffer pointing to the head of a linked list for each byte value appearing in said history buffer; and
   means for updating said history buffer each time a byte is processed by said compression unit and wherein said second order search is performed if the current match length is not extended, said second order search being performed on all previously processed bytes for strings greater than the current match length.

14. The system recited in claim 13 wherein said random access memory further includes:
   a pointer buffer containing a linked list of all occurrences of each byte value appearing in said history buffer, and wherein said pointer buffer is updated as each byte is processed.

15. The system recited in claim 13 further comprising:
   an input buffer containing input bytes for which no compressed representation has been produced.

16. The system recited in claim 11 wherein said data compression unit is in a controller connected between said host computer and said peripheral unit, and wherein said controller contains a control bit enabling and disabling said second order search, said control bit being set by said controller in response to data throughput from said host computer to increase the ratio of compressed bytes to bytes not compressed, thereby reducing said compression rate.

17. The system recited in claim 11 wherein said peripheral is a tape drive.

* * * * *